United States Patent
Shin et al.

(10) Patent No.: US 7,417,246 B2
(45) Date of Patent: Aug. 26, 2008

(54) ORGANIC THIN FILM TRANSISTOR ENHANCED IN CHARGE CARRIER MOBILITY BY VIRTUE OF SURFACE RELIEF STRUCTURE

(75) Inventors: Jung Han Shin, Gyeonggi-Do (KR); Eun Mi Seo, Gyeonggi-Do (KR); Kook Min Han, Gyeonggi-Do (KR); Evgeny Barmatov, Moscow (RU); Valery Shibaev, Moscow (RU)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 361 days.

(21) Appl. No.: 10/845,297

(22) Filed: May 14, 2004

(65) Prior Publication Data

US 2005/0077575 A1    Apr. 14, 2005

(30) Foreign Application Priority Data

Oct. 10, 2003    (KR) ............... 10-2003-0070549

(51) Int. Cl.
*H01L 29/08*  (2006.01)
*H01L 29/22*  (2006.01)

(52) U.S. Cl. .................. 257/40; 257/99
(58) Field of Classification Search ........... 257/40, 257/99
See application file for complete search history.

(56) References Cited

U.S. PATENT DOCUMENTS

| | | | | |
|---|---|---|---|---|
| 5,397,682 A | * | 3/1995 | Matsuoka et al. | 430/283.1 |
| 6,326,640 B1 | * | 12/2001 | Shi et al. | 257/40 |
| 6,586,791 B1 | | 7/2003 | Lee et al. | |
| 6,723,394 B1 | * | 4/2004 | Sirringhaus et al. | 428/1.1 |
| 2003/0008156 A1 | * | 1/2003 | Pocius et al. | 428/457 |
| 2004/0262599 A1 | | 12/2004 | Bernds et al. | |

FOREIGN PATENT DOCUMENTS

| | | |
|---|---|---|
| DE | 101 26 860 A1 | 12/2002 |
| WO | WO 02/073313 A | 9/2002 |
| WO | WO 03/007399 A | 1/2003 |

OTHER PUBLICATIONS

European Search Report for EP Application No. 04256101.9-2203.
Stutzmann, N. Et al.: "Self-Aligned, Vertical-Channel, Polymer Field-Effect Transistors," *Science*, vol. 299 No. 5614, Mar. 21, 2003, pp. 1881-1884.

\* cited by examiner

*Primary Examiner*—Kiesha L Rose
(74) *Attorney, Agent, or Firm*—Buchanan Ingersoll & Rooney PC

(57) ABSTRACT

Disclosed herein is an organic thin film transistor comprising a substrate, a gate electrode, an organic insulating layer, an organic active layer and source/drain electrodes, wherein the interface between the organic insulating layer and the organic active layer is of relief structure. According to the present invention, an organic thin film transistor of enhanced electric properties can be obtained regardless of the organic insulating materials used.

8 Claims, 5 Drawing Sheets

(I)

(II)

US 7,417,246 B2

ORGANIC THIN FILM TRANSISTOR ENHANCED IN CHARGE CARRIER MOBILITY BY VIRTUE OF SURFACE RELIEF STRUCTURE

BACKGROUND OF THE INVENTION

This non-provisional application claims priority under 35 U.S.C. § 119(a) to Korean Patent Application No. 2003-70549 filed on Oct. 10, 2003, which is herein incorporated by reference.

FIELD OF THE INVENTION

The present invention relates to an organic thin film transistor enhanced in charge carrier mobility by virtue of surface relief structure, and more particularly to an organic thin film transistor comprising a substrate, a gate electrode, an organic insulating layer, an organic active layer and source/drain electrodes, wherein the interface between the organic insulating layer and the organic active layer is of relief structure.

DESCRIPTION OF THE RELATED ART

Recently, in the fields of functional electronic and optical elements, the use of polymers as new electronic materials has been actively researched. This is for several reasons, including their ease of molding, softness, conductivity and low production cost. Among those elements produced by the use of conductive polymers, organic thin film transistors (hereinafter, referred to as TFTs) began to be researched in 1980 and have been globally researched since. Currently, organic TFTs are expected to be employed in driving elements of active matrix displays, smart cards, and plastic chips for inventory tags.

Properties of organic TFTs are evaluated based on charge carrier mobility, on/off ratio, threshold voltage and sub-threshold voltage. The use of pentacene in organic active layers was found to improve the properties of organic TFTs so as to be a match for α-Si TFT. On the other hand, the use of organic materials such as polyimide, BCB(benzocyclobutene) and photoacryl in insulating layers of organic TFTs has been attempted, but such organic insulating layers were found inferior to inorganic insulating layers. As uses of organic TFTs have extended to organic electroluminescent devices for driving flexible displays, as well as liquid crystal displays, a charge carrier mobility over 10 $cm^2$/V–sec is required.

In comparison with inorganic insulating layers, organic insulating layers are advantageous in that they can be formed with ease and furthermore provide favorable conditions for the formation of organic active layers. So, efforts to develop novel organic insulating materials that are able to increase grain size of an organic insulating layer and, consequently, charge carrier mobility, have been actively pursued. To date, organic insulating layers having a charge carrier mobility of 1~5 $cm^2$/V–sec have been reported. These materials usually have dielectric constants of 3~4 and are required to have a high driving voltage of –30~50V and a high threshold voltage of –15~20V. To solve these problems, there have been attempts to increase the dielectric constant of organic insulating materials, for example, by dispersing ferro-electric ceramic particles in an insulating polymer (see: U.S. Pat. No 6,586,791) or by mixing an insulating polymer with an organic metal complex of high dielectric constant. In these cases, however, the ceramic particles can affect the formation of an organic active layer and thereby decrease charge carrier mobility, or increase leakage current, resulting in using additional organic insulating materials. Thus, there is a need for developing organic insulating materials that have excellent insulating properties and for improving the arrangement of organic semiconductors.

SUMMARY OF THE INVENTION

A feature of the present invention is to provide an organic TFT that has improved electronic properties, particularly charge carrier mobility, by forming a relief structure at the interface between an organic insulating layer and an organic active layer thereof.

Another feature of the present invention is to provide a method of preparing an organic insulating layer of surface relief structure.

In accordance with the feature of the present invention, there is provided an organic TFT comprising a substrate, a gate electrode, an organic insulating layer, an organic active layer and source/drain electrodes, wherein the interface between the organic insulating layer and the organic active layer is of relief structure.

In accordance with another feature of the present invention, there is provided a process of forming an organic insulating layer, wherein the process comprises the steps of: forming a film of an organic insulating polymer; and exposing the film to incident light from at least one light source of a particular wavelength in an interference pattern of a certain period, thereby making a difference of geometrical height between portions exposed to constructive interference and portions exposed to destructive interference to afford an organic insulating layer of desired surface relief structure.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, the present invention will be described in more detail.

Figure 1:
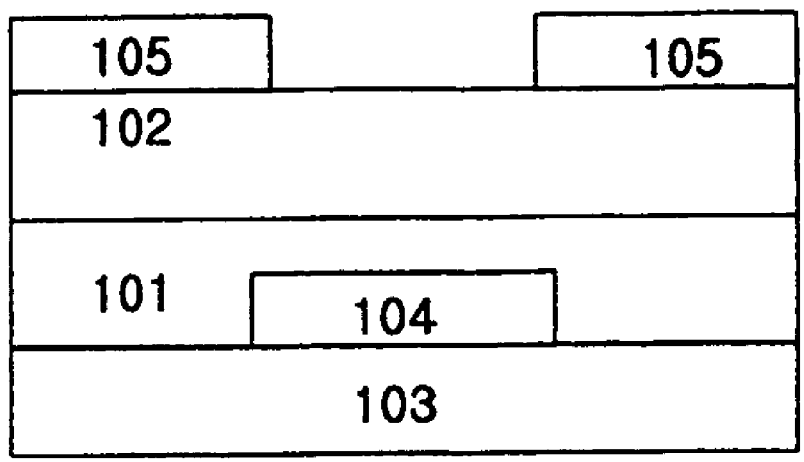
FIG. 1 is a cross-sectional view showing the structure of a conventional organic TFT device.
Figure 2:
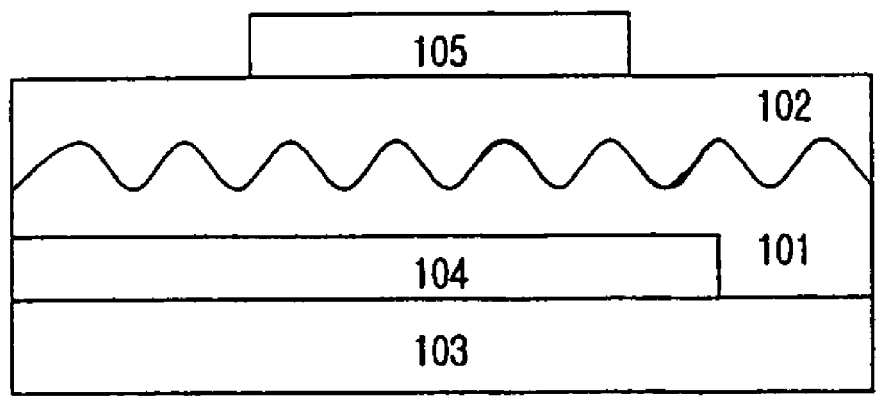
FIG. 2 is a cross-sectional view showing one example of the structure of an organic TFT device of the present invention.

FIG. 1 is a cross-sectional view showing the structure of a conventional organic TFT, and FIG. 2 is a cross-sectional view showing the structure of an organic TFT of the present invention. In FIGS. 1 and 2, the organic TFT comprises a gate insulating layer 101, an organic active layer 102, a substrate 103, a gate electrode 104 and source/drain electrodes 105. As shown in FIG. 2, the organic TFT of the present invention features surface relief structure formed between an organic insulating layer and an organic active layer. However, FIG. 2 merely shows a preferred embodiment of the present invention, and the present invention can be applied to other TFTs of diverse structure provided that it does not impede the objects of the present invention. Also, the surface relief structure is not limited to the embodiment shown in FIG. 2.

The surface relief structure of the organic insulating layer can be formed by mechanical rubbing, poling with electrostatic force, surface relief grating, photolithography, and imprinting or embossing with a mold.

Hereinafter, a process of forming a surface relief structure in the manner of surface relief grating (hereinafter, referred to as SRG) will be described in more detail, but it should be understood that the scope of the present invention is not limited thereto.

Figure 3:
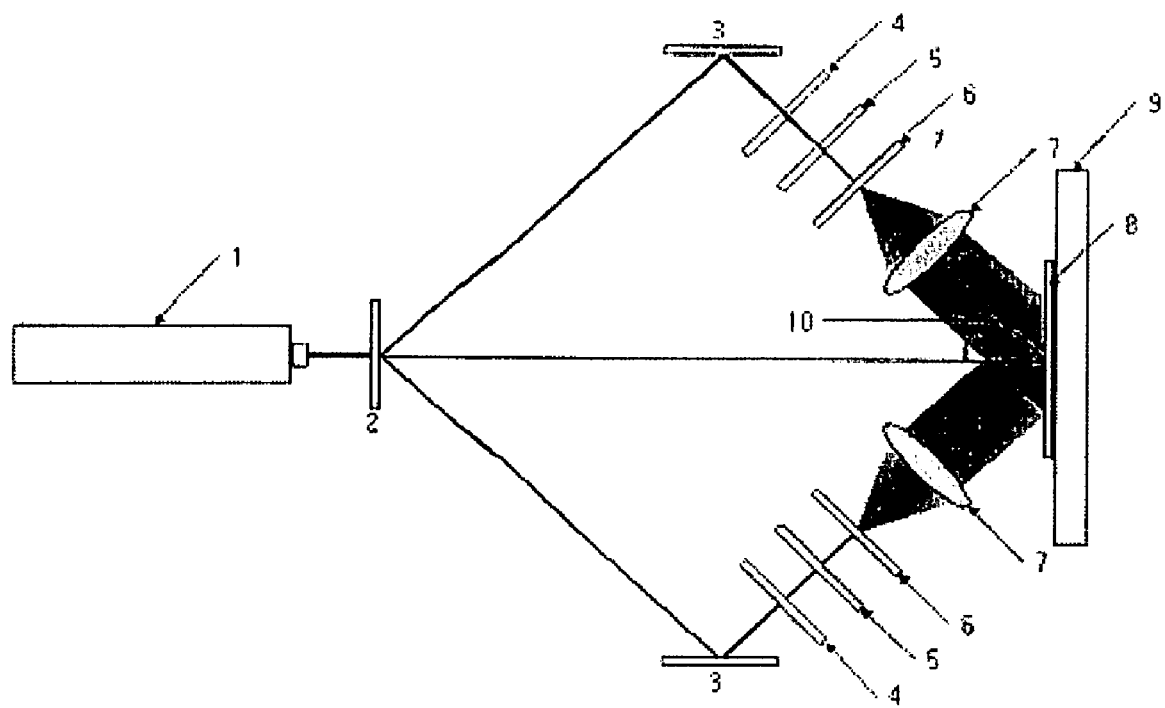
FIG. 3 is a schematic view of equipment for surface relief grating.

FIG. 3 shows an exemplary process of forming a surface relief structure by SRG, wherein an organic insulating layer is formed on a substrate by exposing a polymer to a laser beam of a particular wavelength inducing a physical or chemical reaction of the polymer. More specifically, a beam emitted from laser 1 is divided into two beams using a beam splitter 2. Each beam is reflected at a mirror 3 and passes through a spatial filter 6 comprising an objective lens and a pinhole, resulting in the expansion of its magnitude. At this time, final magnitude and intensity of the expanded beams can be controlled by varying the intensity of the initial laser beam and the objective lens. The two expanded beams, respectively, are made parallel by a collimating lens 7, and a sample glass substrate 8 is placed at the intersection of the two parallel beams. The glass substrate 8 is bonded to a rotational stage 9 that is able to rotate 360° around an axis perpendicular to the glass substrate 8. In consideration of the adhesiveness of the polymeric thin film and the convenience of a later etching process, the glass substrate 8 preferably has a thin coating film of $SiO_2$ thereon. The incident angle($\theta$) of the two parallel beams to the glass substrate 8 can be adjusted in the range of 0~90° in accordance with Bragg's law. The intensity of these two parallel beams can be controlled by the use of a half-wave or quarter-wave plate 4, and furthermore their polarization can be changed by the use of a polarizer 5. The constructive/destructive interferences formed by these two parallel beams exhibit a distribution of light intensity in the form of sine profile.

The period($\Lambda$) of interferences made by two incident beams of the same wavelength($\lambda$) can be calculated from equation (1) according to Bragg's law:

$$2 \Lambda \sin \theta = \lambda \quad (1)$$

In the present invention, $\Lambda$ is controlled such that it is smaller than the emission wavelength of a final display. Through the exposing process as described above, a one-dimensional lattice pattern is generated on the organic insulating layer at regular intervals of $\Lambda$.

Following the exposing process, the organic insulating layer may be further exposed to light of a certain wavelength or be subjected to heating or cooling for a certain time so as to stabilize the surface relief structure thereof.

When source/drain electrodes, which are deposited adjacent to each other, lie in a certain direction, the organic insulating layer of surface relief structure can achieve the greatest improvement of the electronic performance in a final organic TFT. Specifically, it is preferred that the major axis of the surface relief structure runs parallel to the channel(i.e., the shortest course) between the source electrode and the drain electrode(hereinafter, referred to as S-D channel).

In the present invention, the organic insulating layer can be made from a polymer selected from a group consisting of polyolefin, polyvinyl, polyacryl, polystyrene, polyurethane, polyimide, and derivatives thereof. In the case of forming an organic insulating layer in the manner of SRG, a polymer is preferred that possesses, as its main chain or side chain, a moiety capable of participating in photoisomerization, photocrosslinking or photopolymerization, as represented in formulas shown below:

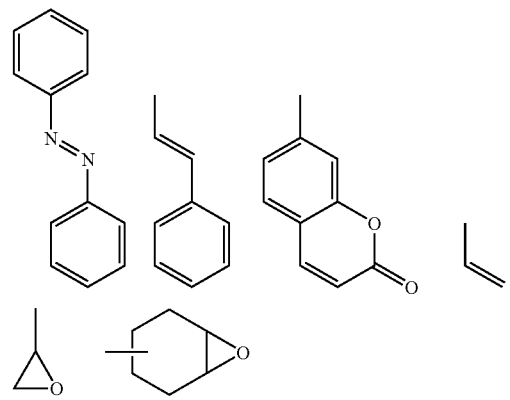

Particularly, moieties capable of participating in photoisomerization or 2+2 photo-induced cycloaddition, such as stilbene, butadiene, dibenzoylethene, rhodopsin and azobenzene, are preferred. Polymers comprising azobenzene moieties are particularly advantageous in that a difference of geometrical height between portions exposed to constructive interference and portions exposed to destructive interference can be readily made in a polymeric film by irradiating the film with an electromagnetic wave of a particular wavelength in an interference pattern of a certain period through SRG.

For the purpose of further stabilizing the surface relief structure thus formed, the polymers used as the insulating materials may possess additional moieties capable of initiating radical polymerization or photopolymerization by exposure to light or heat.

In the present invention, the organic insulating layer can be formed by a conventional wet process such as dip coating, spin coating, printing, spray coating, roll coating, etc.

In the present invention, the organic active layer can be made from commonly used materials including pentacene, copper phthalocyanine, polythiophene, polyaniline, polyacetylene, polypyrrole, polyphenylenevinylene, and derivatives thereof.

In the present invention, the gate and the source/drain electrodes can be made from a commonly used metal or a conductive polymer. Preferred examples of the material for the electrodes include, but are not limited to, Au, Ag, Al, Ni, ITO, polythiophene, polyaniline, polyacetylene, polypyrrole, polyphenylenevinylene and PEDOT(polyethylenedioxythiophene)/PSS(polystyrenesulfonate).

Hereinafter, the present invention will be explained in more detail with reference to the following examples. However, these examples are given for the purpose of illustration and not of limitation.

EXAMPLE 1

Formation of an Organic Insulating Layer of Surface Relief Structure

Figure 4A:
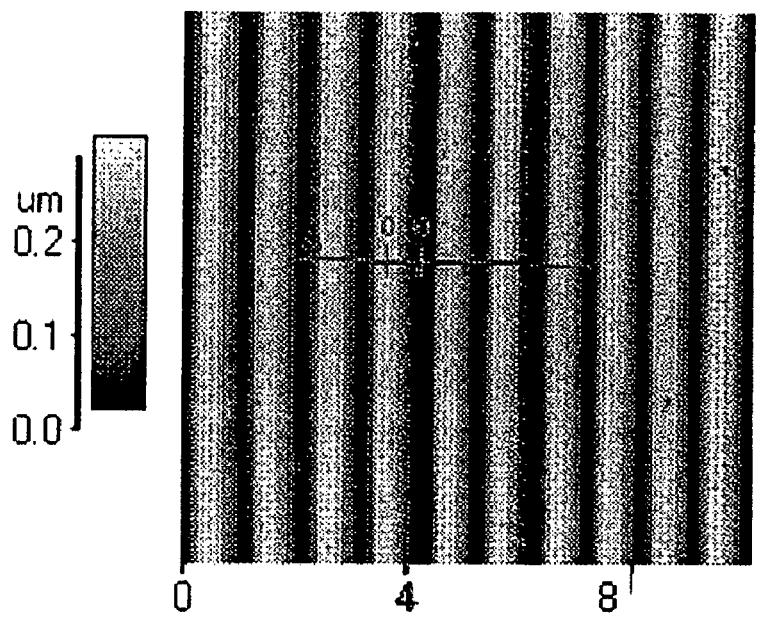
FIGS. 4a and 4b are AFM images of the organic insulating layers of surface relief structure, formed according to Example 1.
Figure 4B:
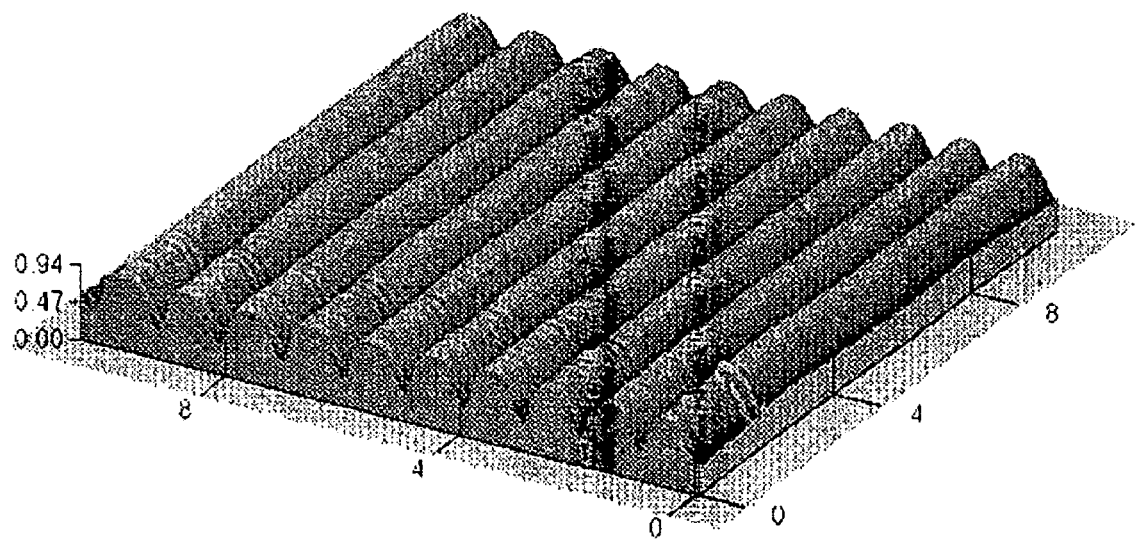

Onto a silicon substrate where a gate electrode was previously deposited, a 10 wt % solution of poly(4-nitrophenylazophenyloxylpentyl methacrylate-co-hydroxyethyl methacrylate) (Mw=35,000, MWD=2.5) in cyclohexanone was applied by spin coating to a thickness of 500 nm. The solvent was evaporated by drying the coated substrate at 100 □ for 10 minutes. The dried substrate was exposed to light having a wavelength of 488 nm by the use of a laser interferometer with an Ar⁺ laser. The incident angle of the laser beam was adjusted to 50° to afford a mono-axial lattice pattern having an interval period($\Lambda$) of 500 nm and a depth of 50 nm. FIGS. 4a and 4b show AFM images of the resulting organic insulating layer.

EXAMPLE 2

Fabrication of an Organic TFT Device Using an Organic Insulating Layer of Surface Relief Structure Onto the organic insulating layer of surface relief structure obtained from Example 1, a 1 wt % solution of poly(dioctylfulorene-co-bithiophene) in toluene was applied by spin coating to a thickness of 70 nm. The solvent was evaporated by drying the coated substrate at 100 □ for 30 minutes. On the resulting organic active layer were deposited source/drain electrodes by the use of a shadow mask having a channel length of 100 μm and a channel width of 2 mm to afford an organic TFT device. The direction of the channel length was equal to that of the major axis of the surface relief structure of the organic insulating layer.

Comparative Example

Fabrication of an Organic TFT Device Using an Organic Insulating Layer not Having a Surface Relief Structure Onto a silicon substrate where a gate electrode was previously deposited, a 10 wt % solution of poly(4-nitrophenylazophenyloxylpentyl methacrylate-co-hydroxyethyl methacrylate) (Mw=35,000, MWD=2.5) in cyclohexanone was applied by spin coating to a thickness of 500 nm. The solvent was evaporated by drying the coated substrate at 100 □ for 10 minutes to afford an insulating layer not having a surface relief structure. Subsequent procedures were performed according to the same manner as in the above Example 2 to afford an organic TFT device.

Electronic properties of the organic TFT devices fabricated in the above Example 2 and Comparative Example were determined from current-transfer curves thereof plotted using a Semiconductor Parameter Analyzer(HP4155A), as described below:

The charge carrier mobility of the devices was calculated using equation (5) from the slope of a graph representing the relationship between $(I_{SD})^{1/2}$ and $V_G$, wherein the graph was plotted according to the following current equations in saturation region (2) and (3) and the slope was calculated using equation (4):

$$I_{SD} = \frac{WC_0}{2L}\mu(V_G - V_T)^2 \quad (2)$$

$$\sqrt{I_{SD}} = \sqrt{\frac{\mu C_0 W}{2L}}(V_G - V_T) \quad (3)$$

$$\text{slope} = \sqrt{\frac{\mu C_0 W}{2L}} \quad (4)$$

$$\mu_{FHT} = (\text{slope})^2 \frac{2L}{C_0 W} \quad (5)$$

In the above equations (2)~(5), $I_{SD}$: source-drain current; μ or $\mu_{FET}$: charge carrier mobility; $C_0$: capacitance of the insulating layer; W: channel width; L: channel length; $V_G$: gate voltage; and $V_T$: threshold voltage.

Threshold voltage ($V_T$) was obtained from the intersection where the $V_G$ axis intersects the extension of the linear portion of the graph representing the relationship between $(I^{SD})^{1/2}$ and $V_G$. As the absolute value of the threshold voltage approximates zero, the consumption of electric power decreases.

Sub-threshold voltage($V_S$) was obtained by taking the reciprocal number of the slope of a portion where the slope increased 10 times at the off-state current. As used herein, "sub-threshold" means the state before the organic TFT reaches the threshold voltage, and "sub-threshold slope" means a variation of the drain current according to the change of the gate voltage prior to reaching the threshold voltage. Typically, the sub-threshold voltage is represented by a variation of the gate voltage necessary for the tenfold increase of the drain current and expressed in the unit of V/dec. As the sub-threshold voltage decreases, control of the channel conductivity relating to gate voltage becomes better.

$I_{on}/I_{off}$ ratio is represented by the following equation (6):

$$\frac{I_{on}}{I_{off}} = \left(\frac{\mu}{\sigma}\right)\frac{C_0^2}{qN_A t^2}V_D^2 \quad (6)$$

In the above equation (6), $I_{on}$: maximum current; $I_{off}$: off-state leakage current; μ: charge carrier mobility; σ: conductivity of the active layer; q: electric charge; $N_A$: electric charge density; t: thickness of the insulating layer; $C_0$: capacitance of the insulating layer; and $V_D$: drain voltage. As can be seen from this equation, the larger the dielectric constant and the smaller the thickness of the dielectric film, the larger the obtained $I_{on}/I_{off}$ ratio is. Therefore, the kind and thickness of the dielectric film are crucial factors for determining the $I_{on}/I_{off}$ ratio. The off-state leakage current is in inverse proportion to the $I_{on}/I_{off}$ ratio.

Off-state leakage current($I_{off}$) refers to the current flowing at the off-state and was determined by taking the minimum current at the off-state from the $I_{on}/I_{off}$ ratio.

The electronic properties thus determined are set forth in Table 1 below:

TABLE 1

| | Charge carrier mobility ($cm^2$/V-sec) | $V_{th}$ (V) | $V_{ss}$ (V/dec) | $I_{on}/I_{off}$ | Leakage current (A) |
|---|---|---|---|---|---|
| Example 2 | 0.035 | −3 | −5 | $1.5 \times 10^2$ | $6 \times 10^{-10}$ |
| Comparative Example | 0.001 | −8 | −13 | $6 \times 10$ | $4 \times 10^{-10}$ |

EXAMPLE 3

Figure 5A:
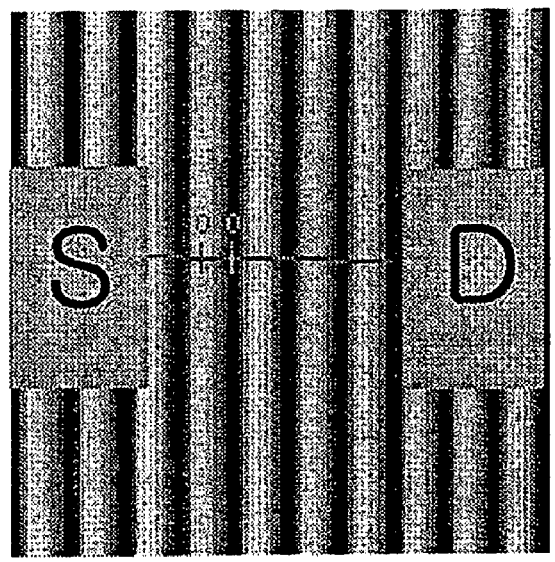
FIGS. 5a and 5b are schematic views showing the direction of source/drain electrodes in the organic TFT devices fabricated according to Example 3.
Figure 5B:
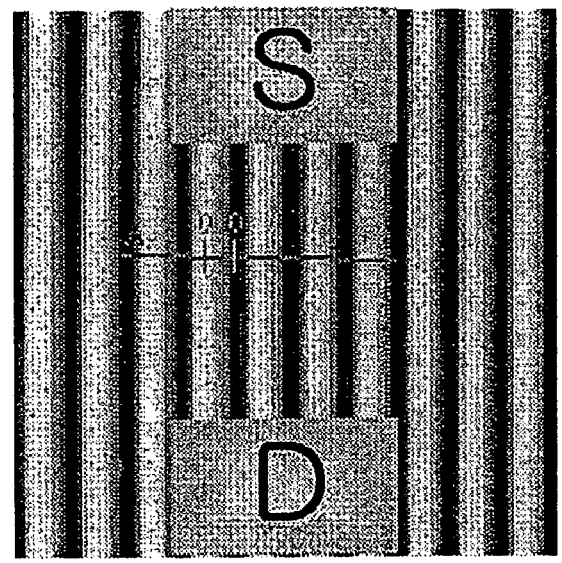

Variation of the Electronic Properties of the Organic TFT Devices According to the Direction of the Surface Relief Structure Two organic TFT devices, in which the major axis of the surface relief structure and the S-D channel were arrayed in the direction as shown in FIGS. 5a and 5b, were fabricated according to Examples 1 and 2 above. The current-transfer curves and charge carrier mobility curves of these devices were plotted in FIGS. 6 and 7, respectively. As a control, the current-transfer curve and charge carrier mobility curve of the device fabricated in the above Comparative Example were plotted simultaneously therewith.

Figure 6:
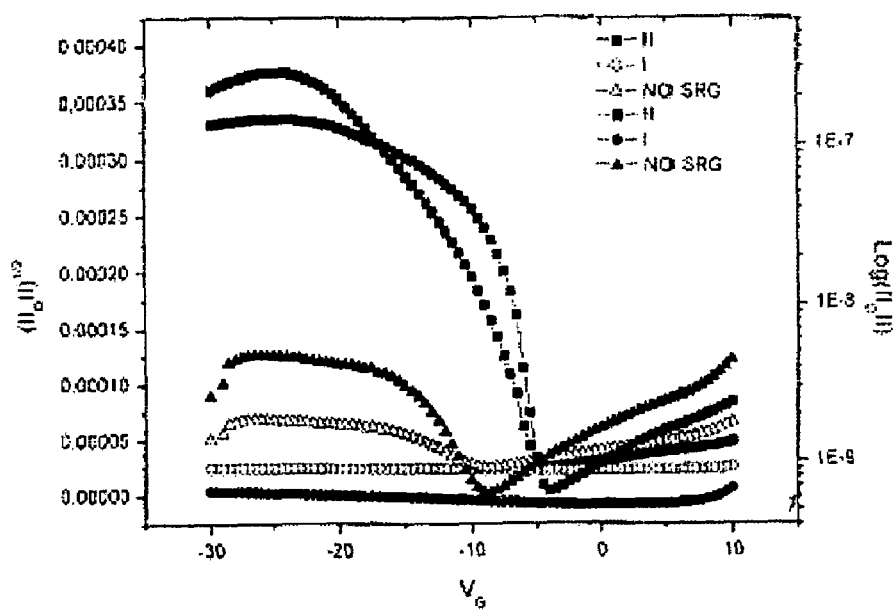
FIG. 6 is a current-transfer curve of the organic TFT device fabricated according to Example 3.
Figure 7:
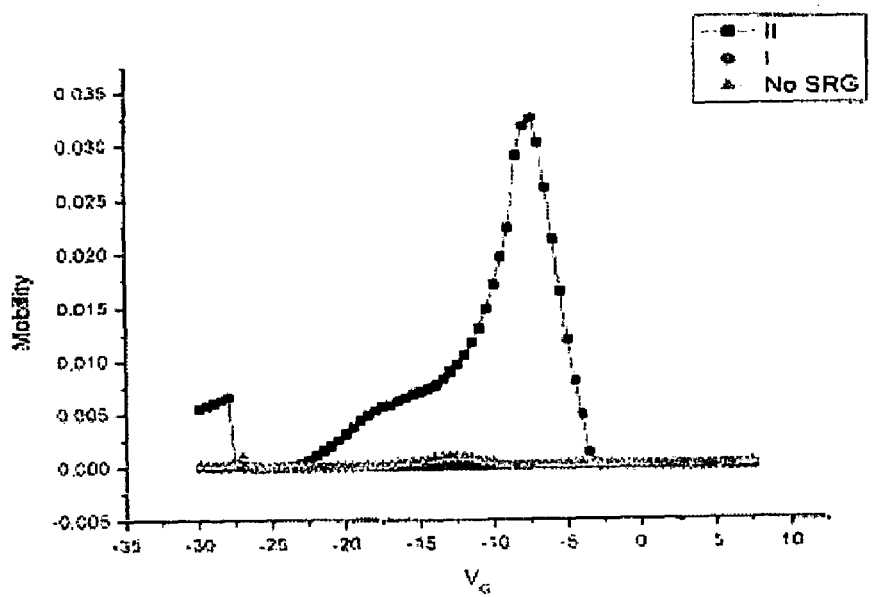
FIG. 7 is a charge carrier mobility curve of the organic TFT device fabricated according to Example 3.

As can be seen from FIGS. 6 and 7, device (II), in which the major axis of the surface relief structure and the S-D channel are parallel to each other, exhibited superior charge carrier mobility to the device (I), in which the major axis of the surface relief structure and the S-D channel are perpendicular to each other. On the other hand, device (I) exhibited equivalent or superior electronic properties to the device without the organic insulating layer of surface relief structure. These results imply that the present surface relief structure is effective to improve the properties of a final organic TFT device and that its direction also has a great effect on the properties of the device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic TFT, wherein the organic TFT comprises a substrate, a gate electrode, an organic insulating layer, an organic active layer and source/drain electrodes, and wherein there is an interface between the organic insulating layer and the organic active layer, and wherein the interface is of relief structure, wherein the organic insulating layer comprises a polymer, wherein the polymer possesses, as its main chain or side chain, a moiety capable of participating in photoisomerization, photocrosslinking or photopolymerization, wherein the moiety capable of participating in photoisomerization, photocrosslinking or photopolymerization is as represented in formulas below:

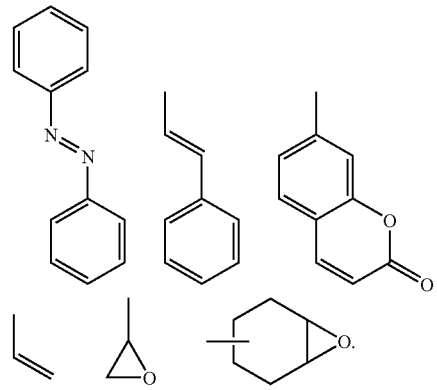

2. The organic TFT according to claim 1, wherein the polymer is selected from the group consisting of polyolefin, polyvinyl, polyacryl, polystyrene, polyurethane, polyimide, and derivatives thereof.

3. The organic TFT according to claim 1, wherein the organic insulating layer is formed by dip coating, spin coating, printing, spray coating or roll coating.

4. The organic TFT according to claim 1, wherein the surface relief structure of the organic insulating layer is formed by mechanical rubbing, poling with electrostatic force, surface relief grating, photolithography, or imprinting or embossing with a mold.

5. The organic TFT according to claim 1, wherein the surface relief structure has a major axis, and wherein the major axis of the surface relief structure runs parallel to a channel between the source electrode and the drain electrode.

6. The organic TFT according to claim 1, wherein the organic active layer comprises a material selected from a group consisting of pentacene, copper phthalocyanine, polythiophene, polyaniline, polyacetylene, polypyrrole, polyphenylenevinylene, and derivatives thereof.

7. The organic TFT according to claim 1, wherein the gate electrode and the source/drain electrodes comprise a material selected from a group consisting of Au, Ag, Al, Ni, ITO, polythiophene, polyaniline, polyacetylene, polypyrrole, polyphenylenevinylene and PEDOT(polyethylenedioxythiophene)/PSS(polystyrenesulfonate).

8. The organic TFT according to claim 1, wherein the substrate is a glass or plastic substrate.

* * * * *